(12) United States Patent
Couture et al.

(10) Patent No.: US 9,917,133 B2
(45) Date of Patent: Mar. 13, 2018

(54) OPTOELECTRONIC DEVICE WITH FLEXIBLE SUBSTRATE

(71) Applicant: General Electric Company, Schenectady, NY (US)

(72) Inventors: Aaron Judy Couture, Schenectady, NY (US); Nicholas Ryan Konkle, Waukesha, WI (US); Andrea Marie Schmitz, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 14/103,989

(22) Filed: Dec. 12, 2013

(65) Prior Publication Data

US 2015/0171134 A1 Jun. 18, 2015

(51) Int. Cl.
*G01T 1/20* (2006.01)
*H01L 27/146* (2006.01)

(52) U.S. Cl.
CPC ...... *H01L 27/14663* (2013.01); *G01T 1/2018* (2013.01); *H01L 27/14632* (2013.01); *H01L 27/14636* (2013.01); *H01L 27/14659* (2013.01); *H01L 27/14687* (2013.01)

(58) Field of Classification Search
CPC ... G01T 1/1642; G01T 1/1644; G01T 1/2018; G01T 1/20; G01T 1/204
USPC ........................................................ 250/366
See application file for complete search history.

(56) References Cited

U.S. PATENT DOCUMENTS 5,319,206 A    6/1994  Lee et al.
5,357,121 A *  10/1994 Miyashita ........... H01L 27/1443
                                                        257/79
5,381,014 A    1/1995  Jeromin et al.
5,399,884 A    3/1995  Wei et al.
5,614,720 A    3/1997  Morgan et al.
5,721,422 A    2/1998  Bird
(Continued)

FOREIGN PATENT DOCUMENTS

CN    101114668 A    1/2008
CN    101718912 A    6/2010
(Continued)

OTHER PUBLICATIONS

Shorey et al.,"Development of Substrates Featuring Through Glass Vias (TGV) for 3D-IC Integration",Downloaded from the Internet:<http://www.corning.com/WorkArea/downloadasset.aspx?id=47685> on Dec. 10, 2013, 3 Pages.
PCT Search Report and Written Opinion issued in connection with corresponding Application No. PCT/US2014/054560 dated Dec. 5, 2014.
(Continued)

*Primary Examiner* — David Porta
*Assistant Examiner* — Mamadou Faye
(74) *Attorney, Agent, or Firm* — Pabitra K. Chakrabarti

(57) ABSTRACT

An optoelectronic device is disclosed. The optoelectronic device includes a flexible substrate, a thin film transistor (TFT) array disposed on a first surface of the flexible substrate, a photodiode layer disposed on the TFT array, and a plurality of data lines and scan lines connected to the TFT array and disposed on the first surface of the flexible substrate. The device further includes a electronics signal module assembly disposed on a second surface of the flexible substrate opposite the TFT array, and an interconnect disposed through the flexible substrate, connecting the data lines and scan lines to the electronics signal module assembly.

11 Claims, 2 Drawing Sheets

(56) References Cited

U.S. PATENT DOCUMENTS

| | | |
|---|---|---|
| 6,181,769 B1 | 1/2001 | Hoheisel et al. |
| 6,205,199 B1 | 3/2001 | Polichar et al. |
| 6,262,421 B1 | 7/2001 | Tran |
| 6,303,943 B1 | 10/2001 | Yu et al. |
| 6,341,153 B1 | 1/2002 | Rivera et al. |
| 6,380,543 B1 | 4/2002 | Kim |
| 6,426,991 B1 | 7/2002 | Mattson et al. |
| 6,465,824 B1* | 10/2002 | Kwasnick et al. ............ 257/290 |
| 6,483,099 B1 | 11/2002 | Yu et al. |
| 6,717,150 B2 | 4/2004 | Hoffman |
| 6,740,884 B2 | 5/2004 | Lee et al. |
| 6,841,784 B2 | 1/2005 | Brahme et al. |
| 6,856,670 B2* | 2/2005 | Hoheisel ....................... 378/98.8 |
| 6,867,418 B2* | 3/2005 | Suzuki ..................... G01T 1/20 |
| | | 250/368 |
| 6,901,159 B2 | 5/2005 | Baertsch et al. |
| 6,904,124 B2 | 6/2005 | Staver et al. |
| 6,970,586 B2 | 11/2005 | Baertsch et al. |
| 6,982,424 B2 | 1/2006 | Vafi et al. |
| 7,053,381 B2 | 5/2006 | Shaw et al. |
| 7,078,702 B2 | 7/2006 | Ringermacher et al. |
| 7,081,627 B2 | 7/2006 | Heismann et al. |
| 7,105,830 B2 | 9/2006 | Nagano et al. |
| 7,122,804 B2 | 10/2006 | Mollov |
| 7,148,486 B2 | 12/2006 | Heismann et al. |
| 7,180,075 B2 | 2/2007 | Brabec et al. |
| 7,196,331 B2 | 3/2007 | Heismann |
| 7,211,825 B2 | 5/2007 | Shih et al. |
| 7,259,037 B2 | 8/2007 | Shih |
| 7,366,280 B2 | 4/2008 | Lounsberry |
| 7,379,528 B2 | 5/2008 | Mattson et al. |
| 7,486,766 B1 | 2/2009 | Nagarkar et al. |
| 7,560,702 B2 | 7/2009 | Meirav et al. |
| 7,605,875 B2 | 10/2009 | Baek et al. |
| 7,606,346 B2 | 10/2009 | Tkaczyk et al. |
| 7,838,994 B2 | 11/2010 | Shibayama et al. |
| 7,897,929 B2 | 3/2011 | Albagli et al. |
| 7,947,960 B2 | 5/2011 | Wu et al. |
| 7,947,961 B2 | 5/2011 | Nys |
| 7,964,903 B2 | 6/2011 | Joo et al. |
| 8,076,647 B2 | 12/2011 | Danielsson et al. |
| 8,084,743 B2 | 12/2011 | Saito et al. |
| 8,120,683 B1 | 2/2012 | Tumer et al. |
| 8,173,969 B2 | 5/2012 | Nishino et al. |
| 8,222,158 B2 | 7/2012 | Mochizuki et al. |
| 8,300,125 B2 | 10/2012 | Ng et al. |
| 8,343,779 B2 | 1/2013 | Buergi et al. |
| 8,405,832 B2 | 3/2013 | Schmaelzle et al. |
| 8,477,125 B2 | 7/2013 | Park et al. |
| 8,605,862 B2 | 12/2013 | Granfors et al. |
| 2002/0079458 A1 | 6/2002 | Zur |
| 2003/0001222 A1 | 1/2003 | Street et al. |
| 2003/0010923 A1 | 1/2003 | Zur |
| 2003/0030004 A1 | 2/2003 | Dixon et al. |
| 2003/0031296 A1 | 2/2003 | Hoheisel |
| 2003/0122083 A1 | 7/2003 | Possin et al. |
| 2003/0210761 A1 | 11/2003 | Hoffman |
| 2003/0227997 A1 | 12/2003 | Petrick et al. |
| 2003/0234364 A1 | 12/2003 | Hennessy et al. |
| 2004/0016886 A1 | 1/2004 | Ringermacher et al. |
| 2004/0085598 A1 | 5/2004 | Kokeguchi et al. |
| 2004/0113086 A1* | 6/2004 | Heismann et al. ...... 250/370.09 |
| 2004/0170861 A1 | 9/2004 | Culligan et al. |
| 2004/0190676 A1 | 9/2004 | Kojima et al. |
| 2004/0229051 A1 | 11/2004 | Schaepkens et al. |
| 2005/0008213 A1 | 1/2005 | Shankarappa et al. |
| 2005/0178971 A1 | 8/2005 | Hoge |
| 2005/0236614 A1 | 10/2005 | Parker |
| 2006/0008054 A1 | 1/2006 | Ohara |
| 2006/0256922 A1 | 11/2006 | Imai et al. |
| 2006/0282946 A1 | 12/2006 | Meyer |
| 2007/0039102 A1 | 2/2007 | Thompson |
| 2007/0085015 A1 | 4/2007 | Castleberry |
| 2007/0257253 A1 | 11/2007 | Im et al. |
| 2007/0262266 A1 | 11/2007 | Hoheisel et al. |
| 2007/0289625 A1 | 12/2007 | Demadrille et al. |
| 2007/0295966 A1* | 12/2007 | Watanabe ......... H01L 27/14665 |
| | | 257/72 |
| 2007/0295973 A1 | 12/2007 | Jinbo et al. |
| 2008/0078940 A1* | 4/2008 | Castleberry et al. .... 250/370.09 |
| 2008/0135891 A1* | 6/2008 | Arias et al. ................... 257/288 |
| 2008/0149652 A1 | 6/2008 | Shoji et al. |
| 2008/0267345 A1 | 10/2008 | Nagumo et al. |
| 2008/0278068 A1 | 11/2008 | Huang et al. |
| 2009/0026379 A1 | 1/2009 | Yaegashi et al. |
| 2009/0026383 A1 | 1/2009 | Kim et al. |
| 2009/0166512 A1 | 7/2009 | Fuerst et al. |
| 2009/0279029 A1 | 11/2009 | Kunii et al. |
| 2009/0285352 A1 | 11/2009 | Schmitt |
| 2010/0059804 A1* | 3/2010 | Hayashi et al. ............... 257/292 |
| 2010/0102242 A1 | 4/2010 | Burr et al. |
| 2010/0102300 A1 | 4/2010 | Burroughes et al. |
| 2010/0148072 A1 | 6/2010 | Fuerst et al. |
| 2010/0155578 A1 | 6/2010 | Matsumoto |
| 2010/0193691 A1 | 8/2010 | Ishii et al. |
| 2010/0224784 A1 | 9/2010 | Homma et al. |
| 2010/0305427 A1 | 12/2010 | Huber et al. |
| 2010/0320391 A1 | 12/2010 | Antonuk |
| 2011/0024711 A1 | 2/2011 | Li et al. |
| 2011/0026685 A1 | 2/2011 | Zilberstein et al. |
| 2011/0042656 A1 | 2/2011 | Burroughes et al. |
| 2011/0049661 A1 | 3/2011 | Maehara et al. |
| 2011/0127504 A1 | 6/2011 | Halls et al. |
| 2011/0168905 A1 | 7/2011 | Yabuta et al. |
| 2011/0204341 A1 | 8/2011 | Brown et al. |
| 2011/0305315 A1 | 12/2011 | Park et al. |
| 2012/0018627 A1 | 1/2012 | Tredwell et al. |
| 2012/0037809 A1 | 2/2012 | Levene et al. |
| 2012/0068076 A1 | 3/2012 | Daghighian |
| 2012/0097858 A1 | 4/2012 | Morf |
| 2012/0121067 A1 | 5/2012 | Hayden et al. |
| 2012/0161018 A1 | 6/2012 | Shin |
| 2012/0161270 A1 | 6/2012 | Maehara et al. |
| 2012/0193542 A1 | 8/2012 | Yamada |
| 2012/0201347 A1 | 8/2012 | Prentice et al. |
| 2012/0201348 A1 | 8/2012 | Knight et al. |
| 2012/0223238 A1 | 9/2012 | Stark |
| 2012/0259378 A1 | 10/2012 | Heinrichs et al. |
| 2012/0267535 A1 | 10/2012 | Nakatsugawa et al. |
| 2013/0082264 A1 | 4/2013 | Couture et al. |
| 2013/0092840 A1 | 4/2013 | Ohta et al. |
| 2013/0140464 A1* | 6/2013 | Iwakiri et al. ................. 250/366 |
| 2013/0140568 A1 | 6/2013 | Miyamoto et al. |
| 2013/0170616 A1 | 7/2013 | Mruthyunjaya et al. |
| 2014/0010353 A1 | 1/2014 | Lalena |
| 2014/0014843 A1 | 1/2014 | Ikeda et al. |
| 2014/0054442 A1 | 2/2014 | Huang et al. |

FOREIGN PATENT DOCUMENTS

| | | |
|---|---|---|
| CN | 201681056 U | 12/2010 |
| CN | 101975787 A | 2/2011 |
| CN | 102539454 A | 7/2012 |
| CN | 102576415 A | 7/2012 |
| CN | 202903698 U | 4/2013 |
| DE | 2520065 B1 | 7/1976 |
| DE | 10136756 A1 | 2/2003 |
| EP | 2328177 A2 | 6/2011 |
| GB | 2317742 A | 4/1998 |
| WO | 9423458 A2 | 10/1994 |
| WO | 20080148815 A1 | 11/2008 |

OTHER PUBLICATIONS

Gong, et al. "High-Detectivity Polymer Photodectors with Spectral Response from 300 nm to 1450 nm", Science vol. 325, Sep. 2009 pp. 1665-1667.

Ng, et al. "Flexible image sensor array with bulk heterojunction organic photodiode", Applied Physics Letters, 92, 2008 pp. 213303-1-213303-3.

"Weld Inspection", GE Measurement & Control, Integrity, safety & productivity through non-destructive testing solutions from GE's Inspection Technologies business, pp. 1-40, Apr. 2012.

(56) References Cited

OTHER PUBLICATIONS

Zhao et al., "X-ray imaging using amorphous selenium: Feasibility of a flat panel self-scanned detector for digital radiology", Medical Physics, vol. No. 22, Issue No. 10, pp. 1595-1604, Jul. 13, 1995.
Granfors et al., "Performance of a 41×41-cm2 amorphous silicon flat panel x-ray detector for radiographic imaging applications", Medical Physics, vol. No. 27, Issue No. 06, pp. 1324-1331, Mar. 13, 2000.
Liu et al., "An Alternate Line Erasure and Readout (ALER) Method for Implementing Slot-Scan Imaging Technique With a Flat-Panel Detector-Initial Experiences", IEEE Transactions on Medical Imaging, , vol. No. 25, Issue No. 04, pp. 496-502, Apr. 2006.
Kao et al., "Fabrication of organic light-emitting devices on flexible substrates using a combined roller imprinting and photolithography-patterning technique, Journal of Vacuum Science & Technology B: Microelectronics and Nanometer Structures," IEEE, vol. No. 24, Issue No. 03, pp. 1278-1282, May 2006.
Greener et al., "Moisture Permeability Through Multilayered Barrier Films as Applied to Flexible OLED Display", Journal of Applied Polymer Science,vol. No. 106, Issue No. 5, pp. 3534-3542, 2007.
Ng et al., "Characterization of Charge Collection in Photodiodes Under Mechanical Strain: Comparison Between Organic Bulk Heterojunction and Amorphous Silicon", Advanced Materials, vol. No. 21, Issue No. 18, pp, 1855-1859, 2009.
Xu et al., "Organic Photodetector Arrays with Indium Tin Oxide Electrodes Patterned Using Directly Transferred Metal Masks", Applied Physics Letters 94 from the American Institute of Physics, vol. No. 94, pp. 043313-1-043313-3, 2009.
Kim et al., "Characteristic Study of Multi-layer using Hybrid Method for Digital X-ray Detector", IEEE Nuclear Science Symposium Conference Record, pp. 3327-3329, 2009.
Phoenix x/act: http://www/ge-mcs .com/download/x-ray/phoenix-x-ray/GEIT-31342EN_x-act.pdf, retrieved on Jan. 1, 2010.
Weisfield et al, "Performance analysis of a 127-micron pixel large-area TFT/photodiode array with boosted fill factor", www.dpix.com/technology/Documents/, Jul. 25, 2011.
Lujan et al., "Flexible X-Ray Detector Array Fabricated With Oxide Thin-Film Transistors", IEEE Electron Device Letters, vol. No. 33, Issue No. 5, pp. 688-690, May 2012.
U.S. Non-Final Office Action issued in connection with Related U.S. Appl. No. 13/728,052 dated May 12, 2014.
U.S. Non-Final Office Action issued in connection with Related U.S. Appl. No. 13/955,355 dated Sep. 25, 2014.
PCT Search Report and Written Opinion issued in connection with Related PCT Application No. PCT/US2014/054558 dated Nov. 20, 2014.
U.S. Final Office Action issued in connection with Related U.S. Appl. No. 13/728,052 dated Nov. 24, 2014.
U.S. Non-Final Office Action issued in connection with RelatedU.S. Appl. No. 14/014,003 dated Feb. 2, 2015.
U.S. Non-Final Office Action issued in connection with Related U.S. Appl. No. 14/109,454 dated Feb. 23, 2015.
U.S. Non-Final Office Action issued in connection with Related U.S. Appl. No. 14/144,253 dated May 27, 2015.
PCT Search Report and Written Opinion issued in connection with Related PCT Application No. PCT/US2015/019468 dated May 28, 2015.
U.S. Non-Final Office Action issued in connection with Related U.S. Appl. No. 13/955,355 dated May 29, 2015.
U.S. Final Office Action issued in connection with Related U.S. Appl. No. 14/109,454 dated Jul. 9, 2015.
U.S. Non-Final Office Action issued in connection with Related U.S. Appl. No. 13/728,052 dated Aug. 6, 2015.
U.S. Final Office Action issued in connection with Related U.S. Appl. No. 14/014,003 dated Aug. 28, 2015.
U.S. Non-Final Office Action issued in connection with Related U.S. Appl. No. 14/109,454 dated Nov. 27, 2015.
U.S. Notice of Allowance issued in connection with Related U.S. Appl. No. 14/144,253 dated Dec. 7, 2015.
U.S. Final Office Action issued in connection with Related U.S. Appl. No. 13/728,052 dated Dec. 31, 2015.
Unofficial English Translation of Chinese Office Action issued in connection with Related CN Application No. 201310741529.4 dated Jan. 4, 2016.
U.S. Final Office Action issued in connection with Related U.S. Appl. No. 13/955,355 dated Feb. 12, 2016.
Unofficial English Translation of Chinese Office Action issued in connection with Related CN Application No. 201410433906.2 dated Apr. 22 2016.
International preliminary Report on Patentability issued in connection with Related PCT Application No. PCT/US2014/054558 dated Jul. 14, 2016.
U.S. Non-Final Office Action issued in connection with Related U.S. Appl. No. 13/955,355 dated Aug. 1, 2016.
U.S. Non-Final Office Action issued in connection with Related U.S. Appl. No. 13/728,052 dated Aug. 19, 2016.
International preliminary Report on Patentability issued in connection with Related PCT Application No. PCT/US2015/019468 dated Sep. 22, 2016.
Unofficial English Translation of Chinese Office Action issued in connection with Related CN Application No. 201410433906.2 dated Oct. 8, 2016.
U.S. Non-Final Office Action issued in connection with Related U.S. Appl. No. 15/122,187 dated Jan. 27, 2017.
U.S. Final Office Action issued in connection with Related U.S. Appl. No. 13/728,052 dated Mar. 10, 2017.

* cited by examiner

OPTOELECTRONIC DEVICE WITH FLEXIBLE SUBSTRATE

BACKGROUND

Portable x-ray detectors are a fast growing market in the medical and industrial markets. Digital x-ray (DXR) detectors are typically fabricated on thick glass substrates. As a result, current portable products have a limited ruggedness specification, including a maximum 30 cm drop height. The glass substrate requires significant package thickness and weight to protect the fragile glass substrate from breaking. Trade-offs may be required to balance detector ruggedness against detector weight and thickness.

Therefore, the critical limitation for a highly portable, front-line deployed digital x-ray detector is the glass substrate. Display technologies such as e-readers and e-books offer the opportunity for a light-weight and rugged substrate. Many of the requirements for an active matrix display overlap with those for a digital x-ray detector. As a result, a flexible display has the potential to be integrated into a rugged digital x-ray detector. A flexible, unbreakable, thin substrate would enable thin, rugged, light-weight x-ray detectors and new processing capability that was not previously possible.

BRIEF DESCRIPTION

The present invention meets these and other needs by providing an optoelectronic device that includes a flexible substrate with electrical interconnects that penetrate through the substrate and allow electrical connections to the back side of the substrate.

Accordingly, in one aspect, the invention relates to an optoelectronic device. The optoelectronic device includes a flexible substrate, a thin film transistor (TFT) array disposed on a first surface of the flexible substrate, a photodiode layer disposed on the TFT array, and a plurality of data lines and scan lines connected to the TFT array and disposed on the first surface of the flexible substrate. The device further includes an electronics signal module assembly disposed on a second surface of the flexible substrate opposite the TFT array, and an interconnect disposed through the flexible substrate, connecting the data lines and scan lines to the electronics signal module assembly.

DETAILED DESCRIPTION

Figure 1:
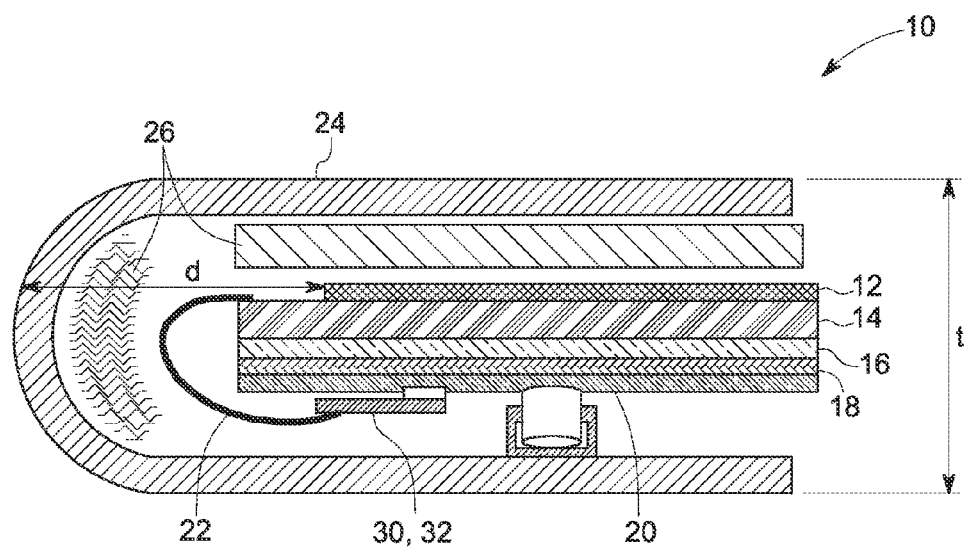
FIG. 1 is a schematic representation of an optoelectronic device of the prior-art.

In the following description, like reference characters designate like or corresponding parts throughout the several views shown in the figures. It is also understood that terms such as "top," "above," "over," "on," and the like are words of convenience and are not to be construed as limiting terms.

One aspect of the invention is to provide a portable optoelectronic device, such as, but not limited to light emitting devices (LED), organic light emitting devices (OLED), photovoltaic devices, light imagers, light emitters, and x-ray detectors.

A general existing electro-optical (alternately optoelectronic) device 10 is as shown in FIG. 1. The device includes an active area (array) 12 on a substrate 14. In general, the substrate 14 in a general optical device such as an optical imager is predominantly made of glass. The glass substrate 14 normally has a mechanical support 16 so that the load and shock experienced by the glass substrate is minimized. The device 10 may further have a backscatter shielding 18 to minimize the scattering of the light waves to the surroundings. The electronics 20 of the device 10 is normally assembled at the back of the substrate 14, preferably back of the backscatter shielding 18, so as to maximize the active area 12 in the front side of the substrate 14.

In a device with the glass substrate 14, the electrical connections from the active area 12 to the electronics 20 were formed through a flexible interconnect (alternately TAB bond) 20. The flexible interconnect 22 is bonded to the active array 12 in the front side of the substrate 14, and wraps around the edge of the substrate 14, substrate support 16, and the backscatter shielding 18 to connect to the electronics signal module assembly including the data module assembly 30 and scan module assembly 32 on the back side and further connect to the electronics 20 modules. The active area 12, substrate 14, and the electronics 20 are covered with a device outer cover (casing) 24. Supports and shock absorbing materials 26 are added inside the device casing 24 on the top, sides, and bottom to protect the substrate 14 glass from breakage.

A distance "d" between the outside of the outer casing 24 and the active area 12 is an important parameter indicating the useful utility of the active area for many imaging applications. Maximization of the available active area 12 may be aided by the minimum "d". With the glass substrate 14, the distance d is increased by the flexible interconnect 22 as well as the panel supports 26. The thickness "t" of the device also increases by the support structures 26 and panel support 16. Replacing the glass substrate 14 with a flexible substrate would reduce the need for the panel support 16 and the support structures and shock absorbing materials.

Figure 2:
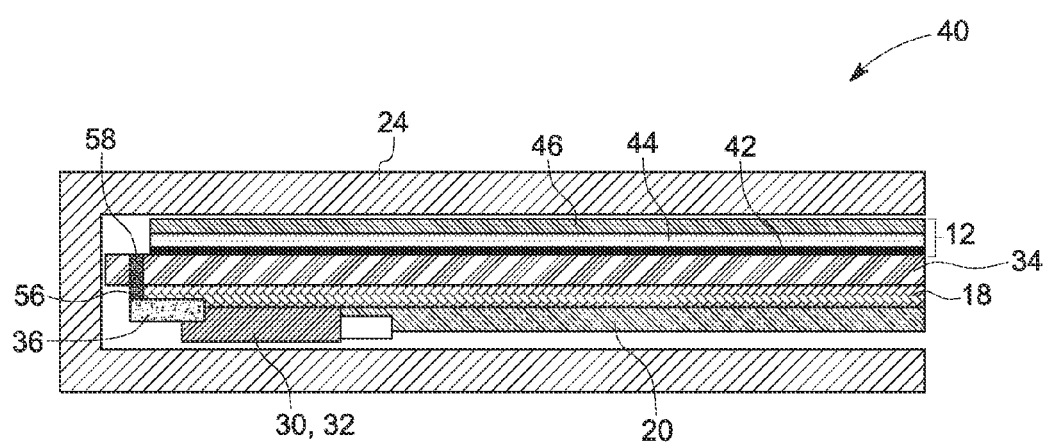
FIG. 2 is a schematic representation of an optoelectronic device having a flexible substrate, according to one embodiment of the present invention.

In one embodiment of the present invention, an optoelectronic device 40 is disclosed as shown in FIG. 2. The optoelectronic device 40 has an active area 12 disposed on a flexible substrate 34. As used herein, a "flexible substrate" is a substrate that can be bent to a radius equal to or less than about 1 centimeter, without any fracture or material delamination that affects the performance of the substrate 34.

Suitable flexible substrate 34 includes a flexible sheet such as a thin plastic sheet, a composite plastic sheet, and metal foils. In one particular embodiment, the flexible substrate includes a polycarbonate. Examples of suitable materials for the flexible substrate are flexible glass, polymers, including polyesters, such as polyethylene terephthalate, polybutylene phthalate, polyethylene naphthalate, polystyrenes, polycarbonates, polymethylmethacrylate, polyether sulfones, polyallylate, polyimides, polycycloolefins, norbornene resins, and fluoropolymers, metal foils, such as stainless steel, aluminum, silver and gold, metal oxides, such as titanium oxide and zinc oxide, and semiconductors such as silicon. Substrate material may include composite materials such as fiber reinforced plastic or carbon composites. Combinations of materials may also be used. By using an unbreakable material instead of a fragile glass substrate for the x-ray detector, the components and materials designed to absorb bending stress or drop shock can be reduced in size and weight or eliminated, and the overall weight and thickness of the detector can be reduced.

In one embodiment, the active area 12, substrate 14, and the electronics 20 are covered with a device outer casing 24. In an alternate embodiment, the electronics 20 may be disposed outside of the casing. Since the flexible substrate is made up of a shock resilient material, there is no need for additional mechanical support for the substrate 34 between upper casing 24 and active area 12, between the electronics assembly 20 and the lower casing 24, and between the substrate 34 and the casing 24 in the sides. There may be an optional backscatter shielding 18 disposed at the back of the flexible support 34 as shown in FIG. 2. In one embodiment, the data module assembly 30 and scan module assembly 32 on the back side of the flexible substrate 34 are disposed inside the casing 24 and connected to the electronics 20 modules. In a further embodiment, the data module assembly 30 and/or the scan module assembly 32 may be connected with the electronics 20 modules through a flexible module.

In one embodiment, the active area 12 of the optoelectronic device 40 includes a thin film transistor (TFT) array 42 and a photodiode layer 44. In one embodiment, the TFT array 42 is disposed on the first surface of the flexible substrate 34 and the photodiode layer 44 is disposed on the TFT array 42. The TFT array 42 may include a plurality of thin film transistors arranged in a particular order on the first surface of the substrate 34. The thin film transistors of the TFT array may be arranged in a side by side manner or may be arranged with gaps in between the individual thin film transistors.

The photodiode layer may include a block of photodiode or may be having a plurality of individual photodiodes arranged in a layer form. The photodiode layer 44 may include organic photodiodes or inorganic photodiodes. Depending on the application and variations in design, the photodiode layer 44 may be of a single layer or may include multiple layers. Further, the photodiode layer 44 may be directly disposed on the TFT array 42 or the design may include one or more layers disposed between the photodiode layer 44 and the TFT array 42. In one embodiment, a plurality of photodiodes is arranged in the photodiode layer 44 on the TFT array 42. In one embodiment, the TFT array 42 is electrically connected to the photodiode layer 44.

Depending on the function of the optoelectronic device 40, there may be additional layers as a part of the active area 12. For example, in one embodiment, the optical device is a light imager. In one embodiment, the light imager is an x-ray detector having a scintillator material. In this embodiment, the scintillator material 46 may disposed on the photodiode layer 42.

In one particular embodiment, the optoelectronic device 40 is a portable x-ray detector and includes the scintillator layer 46 that is excited by an impinging x-ray and produces visible light. The scintillator layer 46 may be a monolithic scintillator or pixelated scintillator array. GOS ($Gd_2O_2S$) is a commonly used low cost scintillator, which is in the form of thin film with millimeter range thickness. Cesium Iodide (CsI) is another scintillator material that can be used for a high sensitivity scintillator, and may be deposited by thermal evaporation. Another scintillator that may be used is a PIB (particle in binder) scintillator, where scintillating particles may be incorporated in a binder matrix material and flattened on a substrate. The visible light generated by the scintillator irradiates the photodiode layer 44 disposed on the TFT array 42.

The visible light impinged on the photodiode layer 44 partially discharges capacitance of the diodes of the photodiode layer 44. The amount of photodiode discharge is proportional to the quantity of the incident light. Each pixel of the TFT array 42 incorporates a switching field effect transistor (FET) used to control when charge is restored to the photodiode capacitance. The charge required to restore the capacitance is provided and measured by external charge measurement circuitry. This circuitry, coupled with the TFT array 42, allows sequential scanning and readout of all photodiodes in the array 44. A custom A/D integrator/converter is normally used to measure the charge required to restore the photodiode to its initial un-discharged state. The magnitude of the discharge is proportional to the incident x-ray dose at each pixel integrated by both the scintillator layer 46 and the photodiode layer 44 during the length of the x-ray exposure. The final x-ray image is reconstructed pixel-by-pixel using the photodiode layer 44 discharge levels to set the image pixel intensity.

Figure 3:
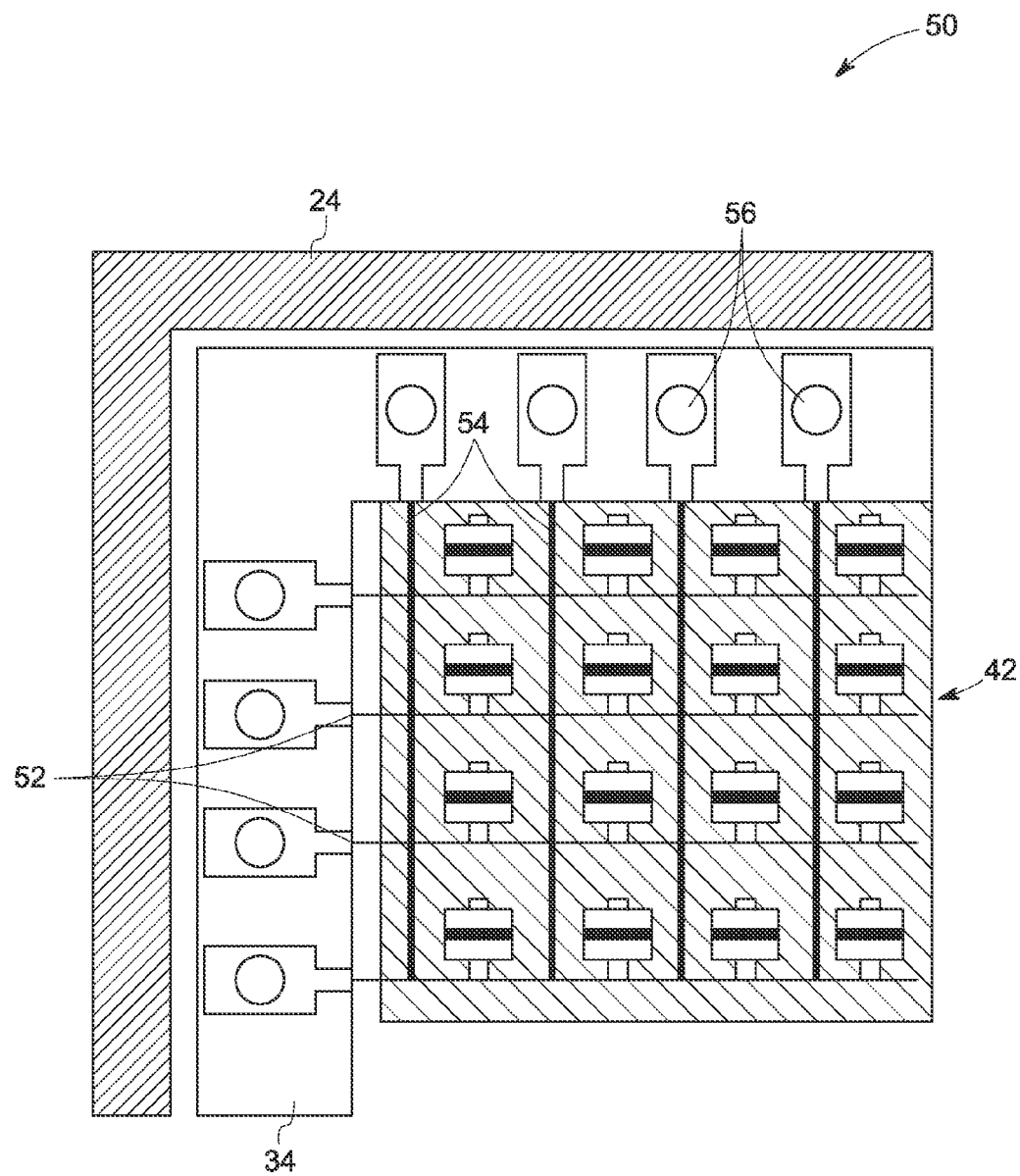
FIG. 3 is a top view of a TFT array, data lines, scan lines, and through via's, according to one embodiment of the present invention.

To provide and measure the charge required to restore the capacitance of the photodiodes by external circuitry, a plurality of data lines 52 and scan lines 54 may be connected to the TFT array 42 and disposed on the first surface of the flexible substrate, as shown in the top view of the TFT array 42 (without showing any of the other active layers on top of TFT array 42) depicted in FIG. 3. The data lines 52 and the scan lines 54 may be connected to each of the transistor of the TFT array 42. Therefore, depending on the number of transistors in the TFT array, there may be hundreds of data lines 52 and scan lines 54 present on the first surface of the flexible substrate 34. In one embodiment, the number of data lines 52 present is more than 1000. In one embodiment, the number of scan lines 54 present is more than 1000.

The data lines 52 and the scan lines 54 need to be connected to the data module assembly 30 and scan module assembly 32 respectively (FIG. 2). In one embodiment, an electronic signal module (not shown) includes the data module assembly 30 and the scan module assembly 32 and is disposed in the backside (second surface) of the flexible substrate 34. In one embodiment, the data module assembly 30 is disposed on the first surface of the flexible substrate 34 and the scan module assembly 32 is disposed in the backside of the flexible substrate 34. In an alternate embodiment, the scan module assembly 32 is disposed on the first surface of the flexible substrate 34 and the data module assembly 30 is disposed in the backside of the flexible substrate 34. In one embodiment, the data module assembly 30 and the scan module assembly 32 are connected to the data lines 52 and the scan lines 54 respectively through a flexible bond. Considering the compliant flexible substrate 34 of the present optical device 40, a through via 56 (FIG. 2 and FIG. 3) may be made through the substrate 34 connecting the first surface and second surface. The data lines 52 may be connected to the data module assembly 30 by passing through the through via 56 without the need to go around the edges of the substrate 34. Similarly, the scan lines 54 may be connected to the scan module assembly 32 by passing through the through via 56 without the need to go around the edges of the substrate 34.

There may be a plurality of through via 56 disposed on the substrate 34 depending on the requirement. The through via's 56 used for the data information (including data signal) transfer to the data module assembly 30 and the scan information (including scan signal) to the scan module assembly 32 may be the same or different. For example, one set of through via's 56 may be exclusively used for the transmission of the data line 52 information to the data module assembly 30, and another set of through via's 56 may be used for the transmission of the scan line 54 information to the scan module assembly 32. An interconnect 58 (FIG. 2) may be passed through the through via 56 for the connection of the data lines 52 with the data module assembly 30 and the scan lines 54 with the scan module assembly 32 through a tab bond pad 36. The interconnect 58 for transfer of the data information to the data module assembly 30 may be different from the interconnect 58 used for the transfer of the scan information to the scan module assembly 32. In one embodiment, the data module assembly 30 and/or the scan module assembly 32 may be connected with the interconnect 58 through a flexible module.

The through via 56 on the flexible substrate 34 may be disposed anywhere on the substrate 34. In one embodiment, the through via 56 is near an edge portion of the flexible substrate 34, and therefore, the interconnect 58 is disposed near an edge portion of the substrate, away from the active area 12. In an alternate embodiment, the through via 56 and the interconnect 58 are disposed in the array portion (not shown) of the flexible substrate 34 where the TFT array 42 is disposed.

In one embodiment of an optoelectronic device 40 having a flexible substrate 34, a clearance between the casing 24 and the flexible substrate 34 at a direction perpendicular to the through via 56 (and parallel to the substrate 34 first surface and second surface) is less than about 0.5 mm. In one embodiment, the distance d between the outer part of casing 24 and the active area 12 is less than about 5 millimeter.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An optoelectronic device comprising:
   a flexible substrate;
   an active area comprising a thin film transistor (TFT) array disposed on a first surface of the flexible substrate and a photodiode layer disposed on the TFT array, wherein the active area defines a border region, offset from the active area and extending to an edge of the flexible substrate;
   a plurality of data lines and scan lines connected to the TFT array and disposed on the first surface of the flexible substrate;
   an electronics signal module assembly disposed on a second surface of the flexible substrate opposite to the TFT array and comprising a data module assembly and a scan module assembly;
   a through via disposed in the border region, extending from the second surface to the first surface of the flexible substrate; and
   an interconnect disposed in the through via, connecting the plurality of data lines to the data module assembly and the plurality of scan lines to the scan module assembly, through a TAB bond.

2. The device of claim 1, wherein the TFT array comprises a plurality of transistors, and wherein each transistor of the TFT array is connected to the electronics signal module assembly.

3. The device of claim 1, wherein the photodiode layer comprises a plurality of photodiodes.

4. The device of claim 1, wherein the TFT array is electrically connected to the photodiode layer.

5. The device of claim 1, wherein the plurality of data lines comprises greater than about 100 data lines.

6. The device of claim 1, wherein the plurality of scan lines comprises greater than about 100 scan lines.

7. The device of claim 1, further comprising a scintillator material disposed on the photodiode layer.

8. The device of claim 7, wherein the flexible substrate, the scintillator material, the TFT array, the photodiode layer, the plurality of data lines, and the plurality of scan lines are disposed inside a casing.

9. The device of claim 8, wherein the electronics signal module assembly is disposed inside the casing.

10. The device of claim 8, wherein the flexible substrate is a shock resilient substrate and a clearance between the casing and the shock resilient substrate is less than about 0.5 mm.

11. The device of claim 1, wherein the device is a portable X-ray detector.

* * * * *